United States Patent
Tan et al.

(10) Patent No.: US 9,568,255 B2
(45) Date of Patent: Feb. 14, 2017

(54) ELECTRONIC DEVICE

(71) Applicant: HTC Corporation, Taoyuan County (TW)

(72) Inventors: Tzu-Chia Tan, Taoyuan County (TW); Chin-Kai Sun, Taoyuan County (TW); Jen-Cheng Lai, Taoyuan County (TW); Chih-Lin Chang, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 225 days.

(21) Appl. No.: 14/257,002

(22) Filed: Apr. 21, 2014

(65) Prior Publication Data
US 2015/0300750 A1    Oct. 22, 2015

(51) Int. Cl.
*G06F 1/20* (2006.01)
*H05K 7/20* (2006.01)
*F28D 15/02* (2006.01)
*F28D 15/04* (2006.01)
*H01L 23/427* (2006.01)

(52) U.S. Cl.
CPC ........... *F28D 15/0275* (2013.01); *F28D 15/04* (2013.01); *G06F 1/203* (2013.01); *H01L 23/427* (2013.01)

(58) Field of Classification Search
CPC ............................. H01L 23/427; G06F 1/203
See application file for complete search history.

(56) References Cited

U.S. PATENT DOCUMENTS

| | | | |
|---|---|---|---|
| 6,418,017 B1* | 7/2002 | Patel | G06F 1/203 165/104.33 |
| 6,508,302 B2* | 1/2003 | Ishida | B21C 37/151 165/104.21 |
| 6,725,910 B2* | 4/2004 | Ishida | B21C 37/151 165/104.21 |
| 6,839,235 B2* | 1/2005 | St. Louis | H05K 7/20672 165/104.33 |
| 7,188,484 B2 | 3/2007 | Kim | |
| 7,342,788 B2* | 3/2008 | Nikfar | F28D 15/0233 165/104.33 |
| 7,443,680 B1* | 10/2008 | Peng | G06F 1/20 165/104.33 |
| 7,580,262 B2* | 8/2009 | Chou | G06F 1/20 165/104.26 |
| 7,607,470 B2* | 10/2009 | Glezer | H01L 23/427 165/104.33 |
| 7,800,907 B2* | 9/2010 | Huang | F28D 15/0233 165/104.26 |
| 7,885,071 B2* | 2/2011 | Huang | H05K 7/20336 165/104.21 |

(Continued)

FOREIGN PATENT DOCUMENTS

TW    361653    6/1999
TW    M469525   1/2014

*Primary Examiner* — Robert J Hoffberg
(74) *Attorney, Agent, or Firm* — Jianq Chyun IP Office

(57) ABSTRACT

An electronic apparatus and a heat dissipation plate are provided. The electronic device includes a frame or a housing, at least one heat generating unit and a heat pipe, wherein the heat dissipation plate includes the frame and the heat pipe. The heat pipe is disposed on the frame or the housing. An orthogonal projection of the heat pipe on the frame or on the housing is partially overlapped with an orthogonal projection of the heat generating device on the frame or on the housing.

2 Claims, 6 Drawing Sheets

(56) References Cited

U.S. PATENT DOCUMENTS

| | | | | |
|---|---|---|---|---|
| 7,924,565 B2* | 4/2011 | Huang | | H05K 7/20336 165/185 |
| 8,004,842 B2* | 8/2011 | Huang | | H05K 7/20672 361/699 |
| 8,075,150 B2* | 12/2011 | Maruyama | | G02F 1/133603 362/561 |
| 8,159,819 B2* | 4/2012 | Memon | | G06F 1/20 165/185 |
| 8,353,333 B2* | 1/2013 | Chen | | F28D 15/0275 165/104.33 |
| 9,013,874 B2* | 4/2015 | Kaldani | | H05K 7/20 165/104.33 |
| 9,244,504 B2* | 1/2016 | Hsieh | | G06F 1/20 |
| 9,247,034 B2* | 1/2016 | Hsieh | | G06F 1/20 |
| 9,307,682 B2* | 4/2016 | Fujieda | | G06F 1/203 |
| 9,381,599 B2* | 7/2016 | Yang | | B23P 15/26 |
| 2008/0173430 A1* | 7/2008 | Jin | | F28D 15/0233 165/104.33 |
| 2013/0105123 A1* | 5/2013 | Chen | | H01L 23/36 165/104.26 |
| 2014/0202666 A1* | 7/2014 | Cheng | | F28F 3/06 165/104.26 |
| 2014/0321058 A1* | 10/2014 | Fujieda | | G06F 1/203 361/700 |
| 2015/0165572 A1* | 6/2015 | Yang | | B23P 15/26 29/890.032 |
| 2015/0253823 A1* | 9/2015 | Han | | G06F 1/203 361/679.52 |
| 2015/0316966 A1* | 11/2015 | Chen | | G06F 1/1658 361/679.47 |
| 2016/0007504 A1* | 1/2016 | Wu | | G06F 1/203 361/700 |
| 2016/0088769 A1* | 3/2016 | Hsiao | | H05K 7/20336 361/700 |
| 2016/0282914 A1* | 9/2016 | Saito | | H05K 7/20336 |

* cited by examiner

ELECTRONIC DEVICE

BACKGROUND OF THE DISCLOSURE

1. Field of the Disclosure

The disclosure relates to an electronic device and a heat dissipation plate, and particularly to an electronic device having a heat pipe and a heat dissipation with a heat pipe thereof.

2. Description of Related Art

In recent years, with the development of the technology industry, information products such as notebook computers, tablet computers, and mobile phones have been widely used in daily lives. Electronic devices are diverse in its styles and functions, and the convenience and the usefulness enables the popularity of those electronic devices.

Generally, a frame is disposed in an electronic device to provide supporting forces to the electronic device. In order for the frame to have enough strength, the frame is generally made of metal materials, such as stainless steels. On the other hand, a central processing unit (CPU), processing chips, or other electronic elements are disposed in the electronic device, and heat is generated during the operation of the electronic elements. Beside the supporting function, the frame may further conduct the aforementioned heat to assist the electronic device dissipating heat. However, stainless steels with higher strength exhibit a problem of lower heat conduction coefficient, so that the heat can not be conducted and dissipated effectively, and thus severely influence the operational efficiency of the electronic device.

SUMMARY OF THE DISCLOSURE

Accordingly, the disclosure is directed to an electronic device having good heat dissipation.

Accordingly, the disclosure is directed to a heat dissipation plate, the heat dissipation plate may be applied to the electronic device, so that the electronic device has good heat dissipation.

An electronic device according to the disclosure includes a frame or a housing, at least one heat generating unit and a heat pipe. The heat pipe is disposed on the frame or the housing, wherein an orthogonal projection of the heat pipe on the frame or on the housing is partially overlapped with an orthogonal projection of the heat generating unit on the frame or on the housing. A heat dissipation plate according to the disclosure is suitable for a circuit board of an electronic device, wherein the circuit board has at least one heat generating unit. The heat dissipation plate includes a frame and a heat pipe. The frame is installed on the circuit board, and the frame has an opening or a recess. The heat pipe is disposed on the frame and is embedded in the opening or the recess, wherein an orthogonal projection of the heat pipe on the frame is partially overlapped with an orthogonal projection of the heat generating unit on the frame.

In light of the foregoing descriptions, in the electronic device and the heat dissipation plate according to the disclosure, the heat pipe is disposed on the frame or the housing. In this way, the heat of the heat generating unit may be conducted to a place with lower temperature via the heat pipe and dissipated, so that the electronic device has good heat dissipating effect.

In order to make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
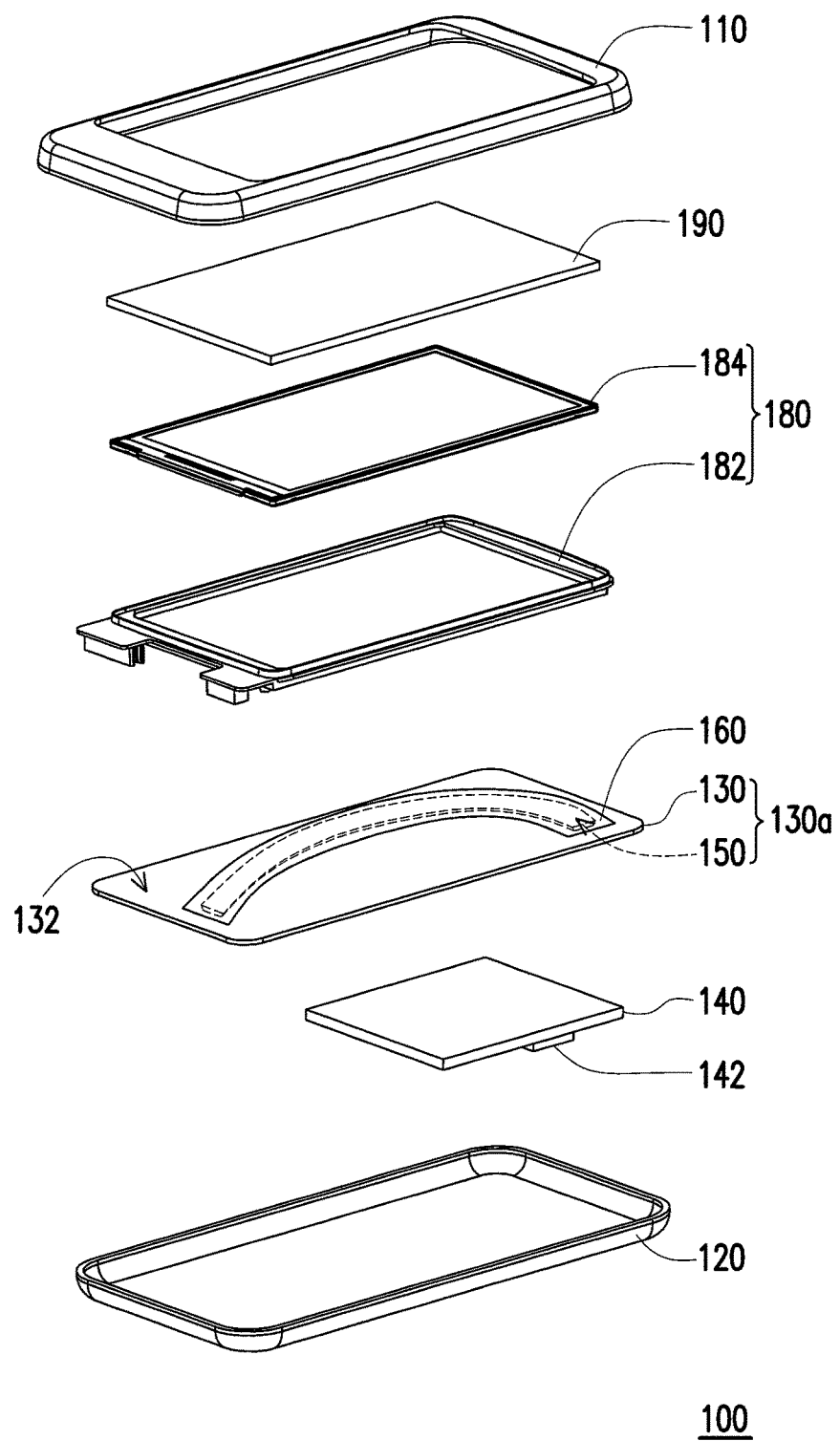
FIG. 1 is an exploded schematic view of an electronic device according to an embodiment of the disclosure.

FIG. 1 is an exploded schematic view of an electronic device according to an embodiment of the disclosure. Referring to FIG. 1, in the embodiment, an electronic device 100 includes a front cover 110, a rear cover 120, a frame 130, a circuit board 140, and a heat pipe 150, wherein the combination of the frame 130 and the heat pipe 150 may form a heat dissipation plate 130a, and the front cover 110 and the rear cover 120 may form an housing of the electronic device 100. The frame 130 is installed between the front cover 110 and the rear cover 120. The circuit board 140 is installed between the frame 130 and the rear cover 120 and has at least one heat generating unit 142.

Figure 2:
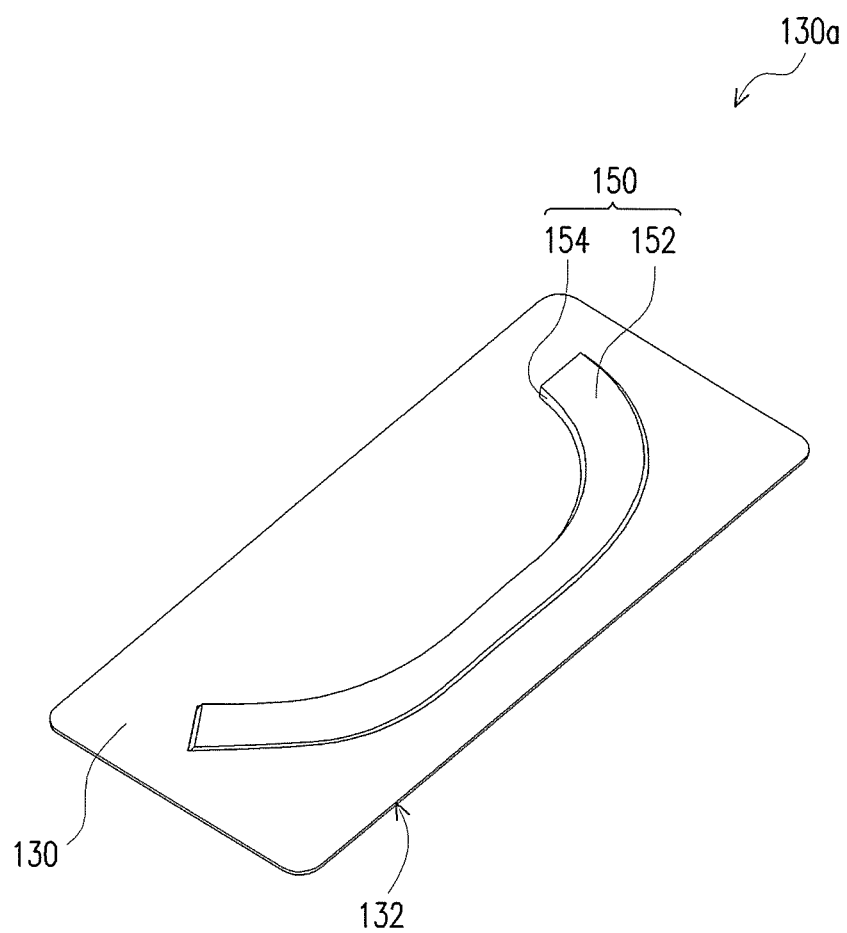
FIG. 2 is a schematic view of the heat dissipation plate in FIG. 1.
Figure 3:
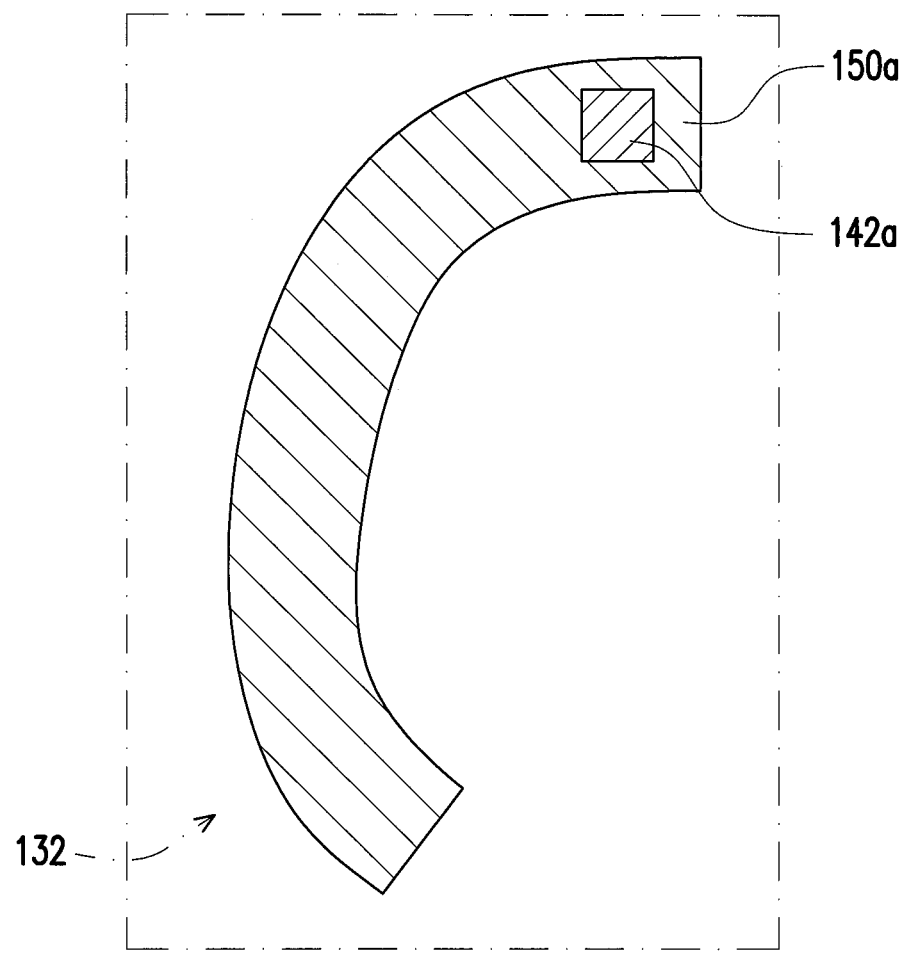
FIG. 3 illustrates orthogonal projections of the heat pipe and the heat generating unit on the surface of the frame in FIG. 2.

FIG. 2 is a schematic view of the heat dissipation plate in FIG. 1. FIG. 3 illustrates orthogonal projections of the heat pipe and the heat generating unit on the surface of the frame in FIG. 2. It should be noted that, in order for the clearness, the view angle of the FIG. 2 is different from that of the FIG. 1. Referring to FIG. 1, FIG. 2 and FIG. 3, the heat pipe 150 is disposed on the frame 130, wherein an orthogonal projection 150a of the heat pipe 150 on the surface 132 of the frame 130 is at least partially overlapped with an orthogonal projection 142a of the heat generating unit 142 on the surface 132 of the frame 130. Specifically, the orthogonal projection 150a of the heat pipe 150 and the orthogonal projection 142a of the heat generating unit 142 overlap, showing that the position of the heat pipe 150 is on a path in which the heat generating unit 142 of the circuit board 140 is disposed. When the heat generating unit 142 of the circuit board 140 generates heat, the heat pipe 150 can effectively conduct heat of the heat generating unit 142 to a place of the electronic device 100 with low temperature and dissipate the heat, so that the electronic device 100 has good heat dissipating effect.

Figure 4:
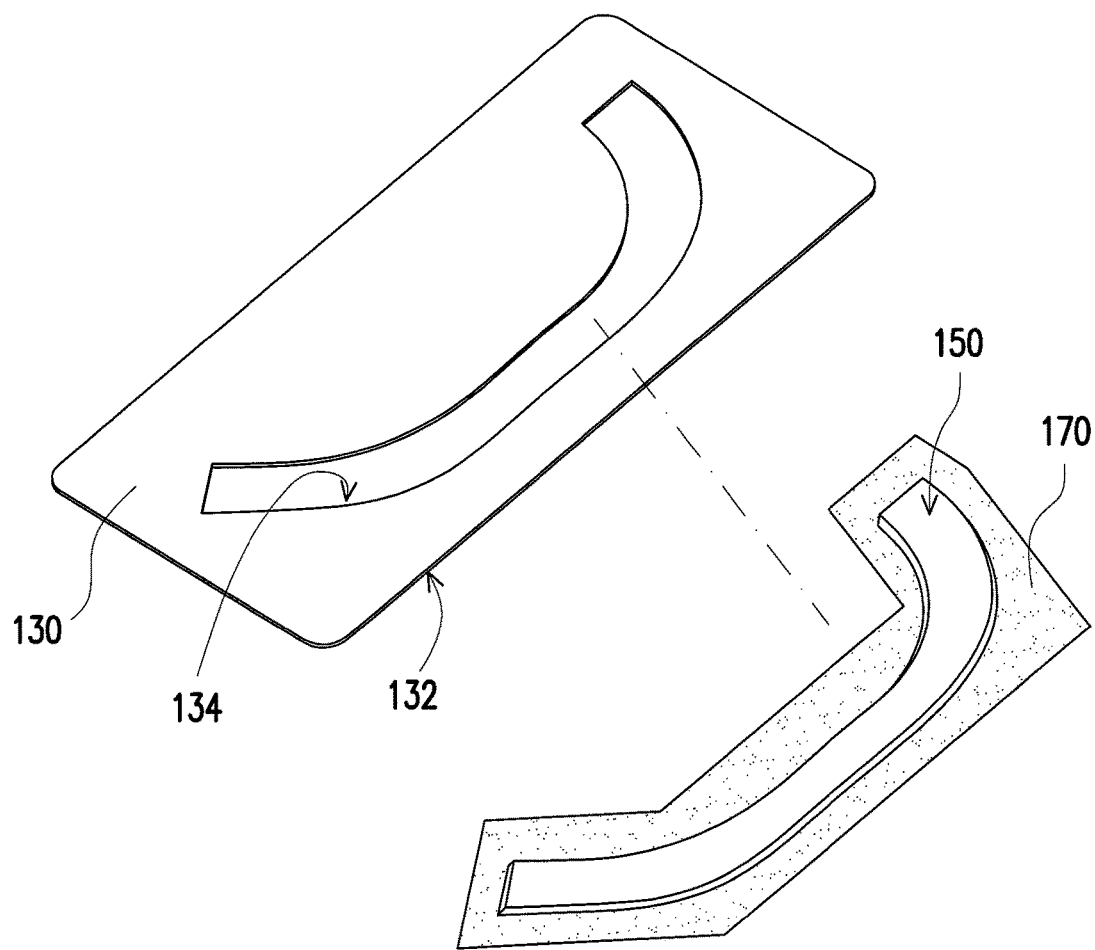
FIG. 4 is a schematic view of the heat pipe and the frame under the condition of separations in FIG. 2.

FIG. 4 is a schematic view of the heat pipe and the frame under the condition of separations in FIG. 2. Referring to FIG. 2 and FIG. 4, the frame 130 of the embodiment has an opening 134, in which the heat pipe 150 is embedded in the opening 134 of the frame 130 via a proper process. For example, after the heat pipe 150 is embedded in the opening 134 of the frame 130, the heat pipe 150 and the frame 130 combine together via a solder. Besides, with the design of the opening 134 of the frame 130, the overall thickness of the combination of the frame 130 and the heat pipe 150 can be reduced. Thus, the requirement for thinning the electronic device 100 can be satisfied. In addition, the opening 134 of the embodiment can be disposed according to a position of the heat generating unit 142 of the circuit board 140. For example, the opening 134 can be disposed at a center of the frame 130 and an edge of the frame 130.

The heat pipe 150 in the embodiment includes a tubular portion 152 and a plate-shaped portion 154. After the heat pipe 150 is embedded in the opening 134, part of the plate-shaped portion 154 is attached to the frame 130, and the tubular portion 152 is disposed in the opening 134. In addition, the heat pipe 150 of the embodiment may be a micro heat pipe, and a thickness of the micro heat pipe is between 0.25 mm to 1.00 mm.

Referring to FIG. 1 and FIG. 4, the electronic device 100 further includes a fixing sheet 160, which is attached between the frame 130 and the heat pipe 150. The heat pipe 150 may be installed to the fixing sheet 160 in advance, and then the heat pipe 150 installed on the fixing sheet 160 is embedded in the opening 134 and combine to the frame 130. Thus, the convenience for installing the electronic device 100 can be enhanced.

Furthermore, the electronic device 100 may further includes a thermally conductive adhesive 170 disposed between the frame 130 and the fixing sheet 160 and between the heat pipe 150 and the fixing sheet 160. The heat of the heat generating unit 142 of the circuit board 140 can be conducted to the heat pipe 150 via the heat conduction of the thermal grease 170, so that the heat of the heat generating unit 142 can be taken away rapidly, and avoiding the generation of thermal resistance by air existed between the frame 130 and the fixing sheet 160.

Figure 6:
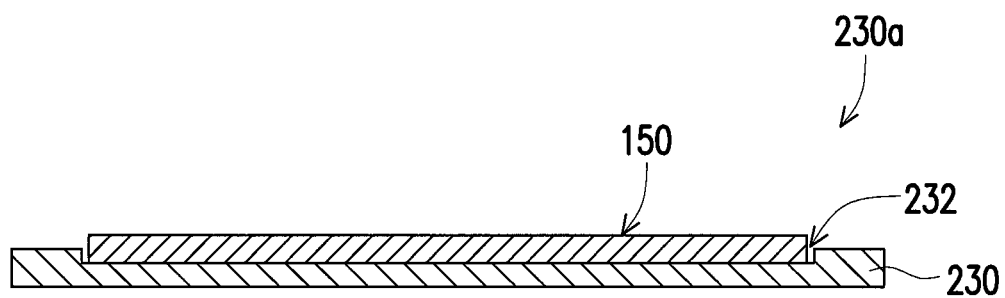
FIG. 6 is a cross-sectional view of a heat dissipation plate according to another embodiment of the disclosure.

FIG. 6 is a cross-sectional view of a heat dissipation plate according to another embodiment of the disclosure. Referring to FIG. 6, the heat dissipation plate 230a of the embodiment is similar to the heat dissipation plate 130a of FIG. 2, only differences therebetween are introduced herein, wherein the same or similar reference numbers represent identical or similar elements, and is not repeated herein. In the embodiment, the frame 230 has a recess 232, in which the heat pipe 150 is disposed in the recess 232 of the frame 230 via a proper process. For example, an adhesive is disposed on a back surface of the heat pipe 150, and the heat pipe 150 and the frame 230 are installed together via abovementioned adhesive after the heat pipe 150 is placed in the recess 232. Besides, the recess 232 may be disposed at a center of the frame 230 or an edge of the frame 230. Those skilled in the art of the disclosure can dispose an opening or a recess on the frame according to practical requirements, and the position disposed with the opening or the recess can be changed.

The heat generating unit 142 of the circuit board 140 of the embodiment may be an electronic element which generates higher heat during the operation of the electronic device 100, such as a central processing unit (CPU), a charging chip, a power management chip, or a radio frequency chip. The abovementioned heat generated by the electronic element which generates higher heat are taken away via the heat pipe 150, so that the electronic device 100 has good heat dissipating effect, and the electronic device 100 maintain stable efficiency.

Referring to FIG. 2, the electronic device 100 of the embodiment further includes a display module 180, disposed between the frame 130 and the front cover 110. In addition, the display module 180 may be composed of a frame 182 and a display panel 184. The frame 182 carries the display panel 184. With this configuration, the electronic device 100 can have a display function. In addition, the electronic device 100 further includes a touch module 190 disposed on the display module 180, and the display module 180 and the touch module 190 are installed together via an optical glue (not shown). Thus, the electronic device 100 can have simultaneously a display function and a touch-control function. Otherwise, the display module 180 may also be integrated to have a touch function.

Figure 5:
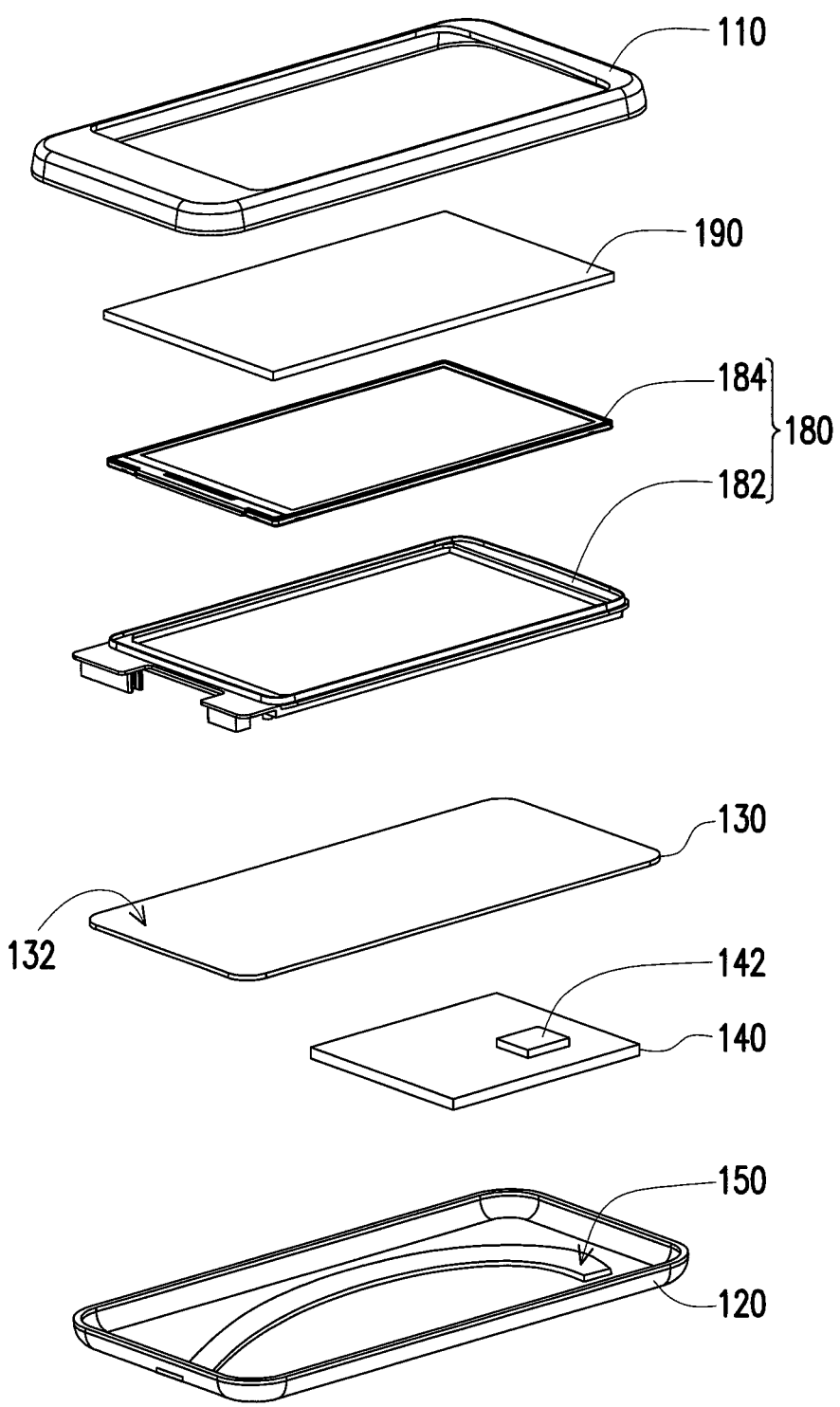
FIG. 5 is an exploded schematic view of an electronic device according to another embodiment of the disclosure.

FIG. 5 is an exploded schematic view of an electronic device according to another embodiment of the disclosure. Referring to FIG. 5, the electronic device 100a of the embodiment is similar to the electronic device 100 of FIG. 1, only differences therebetween are introduced herein, wherein the same or similar reference numbers represent identical or similar elements, and is not repeated herein. In the embodiment, the heat pipe 150 is disposed on the back cover 120, and the orthogonal projection 150a of the heat pipe 150 (referring to FIG. 3) overlaps with the orthogonal projection 142a of the heat generating unit 142. In other words, the heat pipe 150 of the disclosure may be disposed on the frame 130 or the rear cover 120 according to the disposition of the interior space of the electronic device 100. Besides, in another embodiment, the rear cover 120 may be provided with an opening (not shown) or a recess (not shown), the heat pipe 150 can be disposed in the opening or the recess, and the opening or the recess can be disposed at the center or the edge of the rear cover 120 according to the practical requirements.

In summary, in the electronic device and the heat dissipation plate of the disclosure, the heat pipe is disposed on the position corresponding to the position of the heat generating unit. As a result, the heat of the heat generating unit can be conducted to the place with lower temperature via the heat pipe and dissipated. Thus, the electronic device has good heat dissipating effect. Besides, when the frame has an opening, the heat pipe may be embedded in the opening and combine to the frame to reduce the overall thickness of the combined frame 130 and heat pipe 150. Thus, the requirement for thinning the electronic device can be satisfied. Furthermore, the electronic device may further include a fixing sheet and a thermal grease to enhance the convenience for installing the electronic device.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An electronic device mobile handheld device, comprising:
   a housing, comprising a front cover and a rear cover;
   a frame located between the front cover and the rear cover;
   a display module, disposed between the frame and the front cover;
   a touch module, disposed on the display module, a circuit board, attached to the frame;
   at least one heat generating unit disposed on the circuit board; and
   a heat pipe, disposed on the rear cover of the housing and located between the circuit board and the rear cover of the housing, wherein an orthogonal projection view of the heat pipe projected on the rear cover of the housing is at least partially overlapped with an orthogonal projection view of the at least one heat generating unit projected on the rear cover of the housing, and a thickness of the heat pipe is 0.25 mm to 1.00 mm, wherein an area of the frame is larger than an area of the circuit board, and wherein the at least one heat generating unit is a central processing unit, a charging chip, a power management chip, or a radio frequency chip.

2. The mobile handheld device of claim 1, wherein the rear cover of the housing has an opening or a recess, and the heat pipe is disposed in the opening or the recess.

* * * * *